United States Patent [15] 3,662,224
Rauch [45] May 9, 1972

[54] HOLDER FOR ELECTRICAL MODULES WITH CASING ENCLOSING AND CARRYING PRINTED CIRCUIT CARD

[72] Inventor: Gerhard J. Rauch, Burnaby, British Columbia, Canada

[73] Assignee: Cascade Electronics Ltd., Port Moody, British Columbia, Canada

[22] Filed: June 22, 1970

[21] Appl. No.: 48,266

[52] U.S. Cl. .......... 317/101 DH, 317/117
[51] Int. Cl. .......... H05k 5/02, H05k 7/14
[58] Field of Search .......... 317/100, 101 R, 101 CB, 101 DH, 317/117

[56] References Cited

UNITED STATES PATENTS

| | | | |
|---|---|---|---|
| 3,566,193 | 2/1971 | Jorgensen | 317/101 DH |
| 3,060,349 | 10/1962 | Brady | 317/117 X |
| 3,333,156 | 7/1967 | Weisman | 317/101 DH |
| 3,130,351 | 4/1964 | Giel | 317/101 DH |
| 3,467,891 | 9/1969 | Mogle | 317/101 DH |

*Primary Examiner*—Lewis H. Myers
*Assistant Examiner*—Gerald P. Tolin
*Attorney*—Fetherstonhaugh & Co.

[57] ABSTRACT

A module and module guide particularly but not necessarily exclusively for cable television amplifiers in which the guide includes means by which it may be secured to a chassis board and means by which a casing for the module may be secured to the guide.

5 Claims, 4 Drawing Figures

INVENTOR
GERHARD RAUCH
BY
Fetherstonhaugh & Co.
ATTORNEYS

INVENTOR
GERHARD RAUCH
BY
Fetherstonhaugh & Co.
ATTORNEYS

HOLDER FOR ELECTRICAL MODULES WITH CASING ENCLOSING AND CARRYING PRINTED CIRCUIT CARD

This invention is concerned with electrical modules, casings for those modules, guides for the modules and particularly but not necessarily exclusively for use in cable television amplifier systems.

In the design of amplifiers, particularly those used in cable television distribution systems and supported upon messenger cables, it has become common to have various elements of the system assembled into modules which are mounted upon chassis boards within the housing. This facilitates assembly and servicing as is a well known advantage of modular assemblies.

The modules commonly comprise a printed circuit board upon which the various electrical elements are supported and along an edge of which metallic electrical contact clips are supported. These modules have co-operated with a guide secured to the chassis board and having the form of an elongated molding of insulating plastics material and which has a plurality metallic clips located within it, selected ones of which are engaged by the clips along the edge of the printed circuit board.

The proper shielding and grounding of the printed circuit boards and their components and the provision of heat sinks for certain components of the module have in the past been problematical.

This invention seeks to provide a new module and a new guide element for co-operation with the module which facilitates these various functions.

According to one aspect of this invention there is provided a module and a guide element comprising an elongated insulating molding with a plurality of electrical contact clips located therein and having at each end thereof an upstanding tubular element within which a metallic insert is located, the upper and lower ends of each insert being screw-threaded, a module casing having screw-threaded elements for engagement with the screw-threaded upper ends of the metallic inserts detachably to secure the casing to the molding and the lower screw-threaded ends of the inserts serving to receive correspondingly screw-threaded elements to secure the guide element to a chassis board.

An embodiment of this invention is illustrated, schematically, in the accompanying drawings in which.

Figure 1:
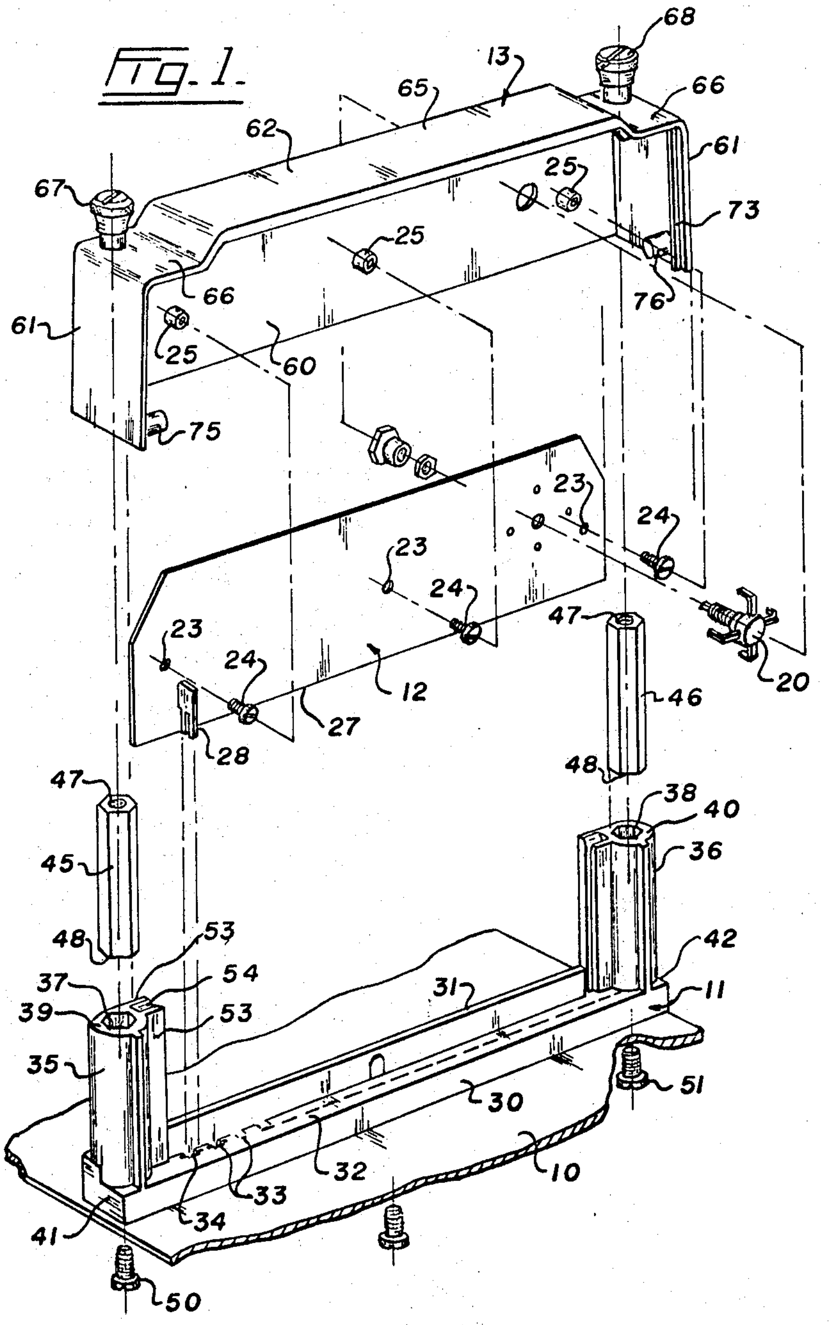
FIG. 1 is an exploded view of an arrangement of module and guide.
Figure 3:
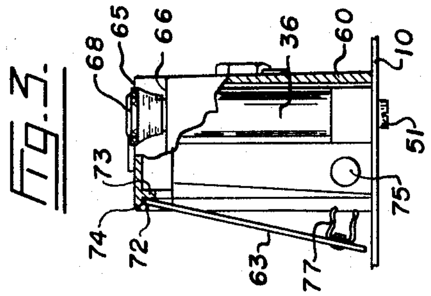
FIG. 3 is an end view, partly in section, of the assembly in FIG. 2.
Figure 2:
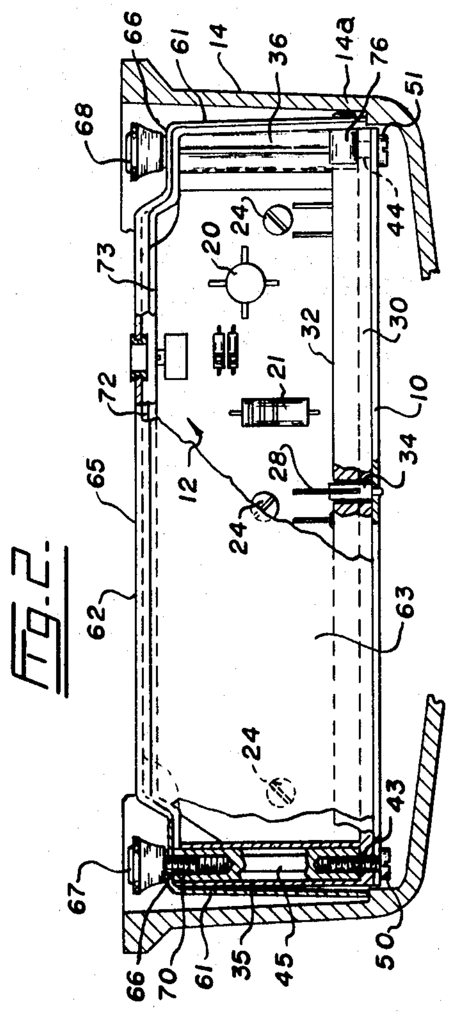
FIG. 2 is a side elevation, partly in section, of the elements of FIG. 1 assembled in a cable television amplifier housing shown in section.
Figure 4:
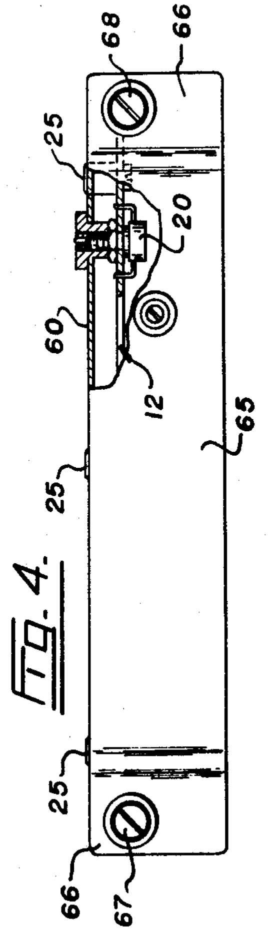
FIG. 4 is a part plan, part sectional view of the assembly of FIGS. 2 and 3.

The assembly in FIG. 1 comprises a chassis board 10, a guide element 11, a printed circuit board 12 and a module casing 13. In FIGS. 2, 3 and 4 the elements of FIG. 1 are shown in situ in an amplifier housing 14.

The amplifier housing may take any of several forms and a common housing comprises a base 14a to which is hingedly connected a lid (not shown in the drawings), by which access may be had to the interior of the base for maintenance purposes. As the invention is applied to an amplifier for use in cable television systems either the base or the lid of the housing will be provided with means by which the housing may be secured or suspended on a messenger cable. A particularly well suited housing is the one described in our co-pending patent application Ser. No. 50,478 filed June 29, 1970.

The manner in which the chassis board 10 is fixed within the housing forms no part of the present invention however a common method and one employed in the housing of the aforementioned co-pending application is to cast, during the die casting of the base, supporting surfaces which are subsequently tapped so that screws may hold the chassis board in position.

The module comprises a generally conventional printed circuit board 12 of rectangular outline with the upper corners relieved to fit conveniently within the module casing as is described in greater detail hereinafter. The board has transistors 20, resistors 21 and other electrical components connected in a circuit to perform the function of the particular module. Holes 23 are formed through the board so that it may be secured, by screws 24 passing through the holes and engaging in threaded standoffs 25, to the casing 13.

Secured in conventional fashion along the lower edge 27 of the board are electrical contact clips 28 of the well known "-wedge" type.

The guide element 11 comprises an elongated body 30 with an upstanding longitudinal flange 31 which serves, in conjunction with other parts of the guide described hereinafter, to polarize the guide and prevent the printed circuit board being put into the guide in other than the correct attitude.

The upper surface 32 of the body 30 has a plurality of longitudinally spaced recesses 33 close to the flange 31 within which are received electrical contact clips 34, again of the wedge kind, and which co-operate with the clips 28 of the printed circuit board.

Formed integrally with the body 30 and located at opposite ends thereof are tubular elements 35 and 36 which are upstanding from the upper surface 32 of the body 30. The elements 35 and 36 are both hollow having hexagonal section passages 37 and 38 respectively extending through them which open at the upper ends 39 and 40 of the elements 35 and 36 respectively. Circular holes 43 and 44 are formed through the body 30 to open into the lower ends 41 and 42 respectively of the passages 37 and 38 of the tubular elements.

Within corresponding ones of the passages 37 and 38 are inserts 45 and 46 respectively which take the form of brass rods of hexagonal outer cross-sectional shape to be received non-rotatably within the passages of the tubular elements of the guide.

The upper and lower ends of the insert 45 have screw-threaded holes 47 and 48 respectively (see FIG. 2) and the insert 46 has similar screw-threaded holes.

The lower screw-threaded holes of the inserts are engaged by screws 50 and 51 which are passed through appropriate holes in the chassis board 10 prior to the chassis board being located within the amplifier housing. The screws 50 and 51 effectively secure the guide to the chassis board in an upright attitude.

Each of the tubular elements has a pair of flanges 53 which define therebetween a guide way 54 within which the lateral marginal edges of the printed circuit board 12 are received and guided so that the contact clips 28 on the lower edge of the printed circuit board properly engage the contact clips 34 in the body 30. The guideways 54 are so located that the clips of the printed circuit board cannot be engaged with the clips of the body unless the printed circuit board is presented to the guide properly oriented thus effectively polarizing the guide.

The module casing 13 comprises a side wall 60, similar opposite end walls 61 and a top wall 62. The casing is completed by a detachable side wall 63 (see FIG. 3).

The top wall 62 has a raised central portion 65 and at each end lowered portions 66. Secured in the lowered portion 66 are captive screws 67 and 68. The raised central section of the top wall allows for the maximum size printed circuit board to be accommodated within the casing while maintaining the overall height of the casing at a minimum by, in effect, lowering the lever of the heads of the captive screws 67, 68. Clearly the side walls 60 and 63 are correspondingly shaped.

The captive screws 67 and 68 are located so that their screw-threaded shanks, one of which is visible in FIG. 2 and is accorded the reference numeral 70, are engageable within the screw-threaded holes 47 of the upper ends of the brass inserts 45 and 46 in the tubular elements in this way to secure the casing in the appropriate position atop the guide and printed circuit board.

The edge of top wall 62 remote from side wall 60 is provided with a pair of short ribs 72 and 73 which extend along the edge of the top wall remote from the side wall 60 to define therebetween a groove 74 within which the marginal edges of the detachable side wall 63 can be accommodated in the manner more particularly illustrated in FIG. 3.

The innermost one of the ribs 73 is continued along the edges of the end walls 61 to provide an abutment for the vertical edges of the detachable side wall 63.

Towards the lower edges of the end walls 61 remote from the side wall 60 are formed pegs 75, 76 which co-operate with spring clips elements 77 secured in corresponding positions towards the lower edge of the detachable side wall 63 so that as the upper edges of the side walls 63 is engaged in the groove 74 defined by the ribs 72, 73 of the upper wall of the casing and the side edges of the wall 63 are brought into abutment with the continuation of rib 73 along the end walls 61 so the spring clips engage upon pegs 75 and 76 to hold that side wall in position to complete the enclosure of the printed circuit board.

It will be appreciated that the assembly of this invention serves several functions.

The guide effectively secures the module in position and additionally the brass inserts in the tubular elements serve the purposes of securing the guide element firmly to the chassis board by co-operating with the screws 50, 51 passed through the chassis board, the holes in the body 30 and into the screw-threaded holes 48 in the ends of the element. The brass inserts also constitute a connection through which the printed circuit board and its components may be grounded to the chassis board and to the amplifier housing and serve as a heat sink for the components of the printed circuit board.

I claim:

1. A holder for a modular circuit board comprising a guide element having an elongated body with a plurality of electrical contact clips located therein, a circuit board having a lower edge provided with electrical contact clips engaged with the electrical contact clips of the elongated body, an upstanding tubular element at each opposite end of the elongated body, a metallic insert in each tubular element, the upper ends of the metallic inserts being screw-threaded; a casing fitting over the circuit board and the tubular elements and having a top, side and end walls; said top wall having captive screw-threaded elements engaging with the screw-threaded upper ends of the inserts detachably to secure the casing to the guide element, means detachably securing the circuit board to the casing, and a second side wall detachably secured to the casing whereby the circuit board is completely enclosed within said casing and the guide element.

2. A holder as claimed in claim 1 and including a chassis board extending beneath the guide element, said metallic inserts having screw-threaded lower ends, and screw-threaded elements cooperating with the screw-threaded lower ends of the metallic inserts to secure the guide element to the chassis board.

3. A holder as claimed in claim 3 in which said tubular elements having opposing guideways formed thereon to receive marginal side edges of the circuit board.

4. A holder as claimed in claim 4 in which said inserts are non-rotatably received in the tubular elements.

5. A holder for a modular circuit board comprising a guide element having an elongated body with a plurality of electrical contact clips located therein, a circuit board having a lower edge provided with electrical contact clips engaged with the electrical contact clips of the elongated body, an upstanding tubular element at each opposite end of the elongated body, said tubular elements having opposing guideways formed thereon to receiving marginal side edges of the circuit board, a metallic insert non-rotatably mounted in each tubular element, the upper and lower ends of the metallic inserts being screw-threaded; a casing fitting over the circuit board and the tubular elements and having top, side and end walls; said top wall having captive screw-threaded elements engaging with the screw-threaded upper ends of the inserts detachably to secure the casing to the guide element, means detachably securing the circuit board to the side wall of the casing with the marginal edges of said board entered into the guideways, a second side wall detachably secured to the casing whereby the circuit board is completely enclosed within said casing and the guide element, and a chassis board extending beneath the guide element, and screw-threaded elements co-operating with the screw-threaded lower ends of the metallic inserts to secure the guide element to the chassis board.

* * * * *